US007895017B2

(12) United States Patent
McDonald et al.

(10) Patent No.: US 7,895,017 B2
(45) Date of Patent: Feb. 22, 2011

(54) SYSTEM TO INCREASE SNR OF CPV-GENERATED POWER SIGNAL

(75) Inventors: Mark McDonald, Milpitas, CA (US); Stephen J. Horne, El Granada, CA (US)

(73) Assignee: Solfocus, Inc., Mountain View, CA (US)

( * ) Notice: Subject to any disclaimer, the term of this patent is extended or adjusted under 35 U.S.C. 154(b) by 273 days.

(21) Appl. No.: 12/179,179

(22) Filed: Jul. 24, 2008

(65) Prior Publication Data
US 2010/0023138 A1  Jan. 28, 2010

(51) Int. Cl.
*G01R 21/00* (2006.01)
*G01R 21/06* (2006.01)
*G06F 17/40* (2006.01)
*G06F 19/00* (2006.01)

(52) U.S. Cl. .................. 702/187; 324/76.11; 324/96; 702/60; 702/189

(58) Field of Classification Search ................ 126/569, 126/572, 573, 574, 578, 600, 601; 324/76.11, 324/96; 700/1, 28, 32, 56, 57, 61, 62, 90, 700/302; 702/1, 2, 3, 57, 60, 64, 65, 127, 702/150, 151, 152, 153, 187, 188, 189
See application file for complete search history.

(56) References Cited

U.S. PATENT DOCUMENTS

| | | | |
|---|---|---|---|
| 4,086,485 A | 4/1978 | Kaplow et al. | |
| 4,202,321 A | 5/1980 | Volna | |
| 4,215,410 A | 7/1980 | Weslow et al. | |
| 4,320,288 A | 3/1982 | Schlarlack | |
| 4,564,275 A | 1/1986 | Stone | |
| 4,612,488 A | 9/1986 | Uhlemann et al. | |
| 6,239,353 B1 | 5/2001 | Hall et al. | |
| 6,465,725 B1 | 10/2002 | Shibata et al. | |
| 6,574,174 B1 | 6/2003 | Amble et al. | |
| 6,661,815 B1 | 12/2003 | Kozlovsky et al. | |
| 6,680,693 B2 | 1/2004 | Urban et al. | |

(Continued)

FOREIGN PATENT DOCUMENTS

DE      295 19 857 U1      4/1997

(Continued)

OTHER PUBLICATIONS

PCT International Search Report dated Feb. 10, 2010 for PCT/US2009/050510, 3pgs.

(Continued)

*Primary Examiner*—Edward R Cosimano
(74) *Attorney, Agent, or Firm*—Buckley, Maschoff & Talwalkar LLC

(57) ABSTRACT

A system may include acquisition of power information from a signal line in accordance with a first signal characteristic. The power information is associated with power generated by a solar collector, and the first signal characteristic is substantially orthogonal to a corresponding signal characteristic of at least one noise source associated with the signal line. In some aspects, a solar tracking error associated with the solar collector is determined based on the acquired power information, a servo feedback signal is determined based on the acquired power information, and determination of the solar tracking error includes determination of the solar tracking error based on the servo feedback signal.

20 Claims, 13 Drawing Sheets

U.S. PATENT DOCUMENTS

| | | |
|---|---|---|
| 6,704,607 B2 | 3/2004 | Stone et al. |
| 2006/0266408 A1* | 11/2006 | Horne et al. ................. 136/246 |
| 2009/0050191 A1* | 2/2009 | Young et al. ................. 136/246 |
| 2010/0012169 A1* | 1/2010 | Jensen et al. ................. 136/246 |
| 2010/0018518 A1* | 1/2010 | McDonald .................. 126/572 |
| 2010/0018519 A1* | 1/2010 | McDonald et al. ........... 126/573 |

FOREIGN PATENT DOCUMENTS

| | | |
|---|---|---|
| JP | 57-148135 A | 9/1982 |
| JP | 59-009457 A | 1/1984 |
| JP | 2000223730 | 8/2000 |
| JP | 2002202817 | 7/2002 |
| WO | 02/079793 A1 | 10/2002 |
| WO | 2008/003023 A2 | 1/2008 |

OTHER PUBLICATIONS

PCT International Search Report dated Mar. 17, 2010 for PCT/US2009/050485, 3pgs.

Philip Gleckman, "Rooftop photovoltaic system using high concentration: An optical perspective", Energy Innovations, Inc., [undated], 12 pgs.

I. Luque-Heredia et al., "11 Inspira's CPV Sun tracking", [undated], pp. 221-251, total 31pgs.

"Rugged, Reliable, Cost-Effective Solar Tracking", RayTracker GC, Energy Innovations [undated]. 2pgs.

* cited by examiner

US 7,895,017 B2

SYSTEM TO INCREASE SNR OF CPV-GENERATED POWER SIGNAL

BACKGROUND

A solar collector may receive solar radiation (i.e., sunlight) and direct the solar radiation onto a photovoltaic (or, solar) cell. A "concentrating" solar collector may also convert the received solar radiation into a concentrated radiation beam prior to directing the radiation onto the solar cell. The cell, in turn, may generate electrical power based on photons of the received radiation.

A solar collector is designed to generate power in response to radiation which intercepts the solar collector within a certain range of incidence angles. Power generation typically drops significantly if incoming radiation deviates from the range of incidence angles. The range depends on the design of the solar collector, and typically narrows with increasing concentration factors. For example, in some solar collector designs providing approximately 500-fold concentration, the range of incidence angles providing suitable power generation extends only one degree from normal.

In operation, a solar collector is aligned with a radiation source (e.g., the sun) such that incoming radiation intercepts the solar collector within its preferred range of incidence angles. According to some systems, a solar collector is associated with a central axis perpendicular to its reception surface, and the foregoing alignment consists of moving the solar collector so that the axis points directly toward the apparent position of the sun in the sky. As mentioned above, power generation may be significantly compromised due to any errors in aligning the axis with the sun. Possible causes of such error include errors in determining the sun's apparent position, and mechanical calibration errors, which may result in misalignment between the axis and the sun even if the sun's position is known.

Various control systems for aligning a solar collector with the sun are known. In a closed loop control system, a sun sensor is aligned to an axis representing a preferred incidence angle of the solar collector. The sun sensor determines any error between the axis and the sun's apparent position, and a position of the solar collector is changed to compensate for the error. Closed loop control systems may incorrectly determine (or may be unable to determine) the solar position if the sun is obscured (e.g., by clouds or debris deposited on the sun sensor) or if a portion of the solar collector is obscured. Closed loop control systems are also required to maintain the alignment between the sun sensor and the axis while being subjected to environmental hazards.

An open loop control system may determine the position of the sun based on a location of the solar collector, a current time, and a set of ephemeris equations. The solar collector is positioned so that the determined solar position results in reception of radiation at its preferred angle of incidence. Since such open loop control systems do not provide any feedback for determining whether the solar collector is correctly positioned (i.e., aligned with the sun and/or generating maximum power for a given solar intensity), these systems are susceptible to mechanical errors and perturbations.

Many factors may prevent an open loop control system from aligning a solar collector with a properly-calculated solar position. These factors include manufacturing tolerances, wind and gravity loading, subsidence of a solar collector foundation, creep in the mounting of the collector or its internal optics, and optic degradation. Some systems address these and other factors by determining correction information and using the correction information to correct a calculated solar position or to correct alignment of a solar collector with a given solar position.

The above-described correction information may be determined every few weeks or months. To determine correction information, a solar collector may be aligned with various positions until a maximum short-circuit current ($I_{sc}$) is detected. Correction factors are determined based on a difference between a calculated determined solar position and a position at which the maximum $I_{sc}$ was detected. Some systems collect such correction factors at several different times of day. The correction factors may be weighted against previously-acquired correction factors and/or interpolated to determine correction factors to be used at times of day other than those at which correction factors was collected.

A solar collector does not deliver power during the above-described collection of correction factors. Moreover, new alignment errors may occur during the weeks or months between correction factors collection. Accordingly, the foregoing systems are unable to correct for such new errors until a next collection of correction factors. Even if no new errors have occurred since a last collection of correction factors, the correction factors will only provide a solar collector position at which $I_{sc}$ is maximized. In contrast, it would be more desirable to provide a system which attempts to maximize actual power delivered to the grid.

DESCRIPTION

The following description is provided to enable any person in the art to make and use the described embodiments and sets forth the best mode contemplated for carrying out some embodiments. Various modifications, however, will remain readily apparent to those in the art.

Figure 1:
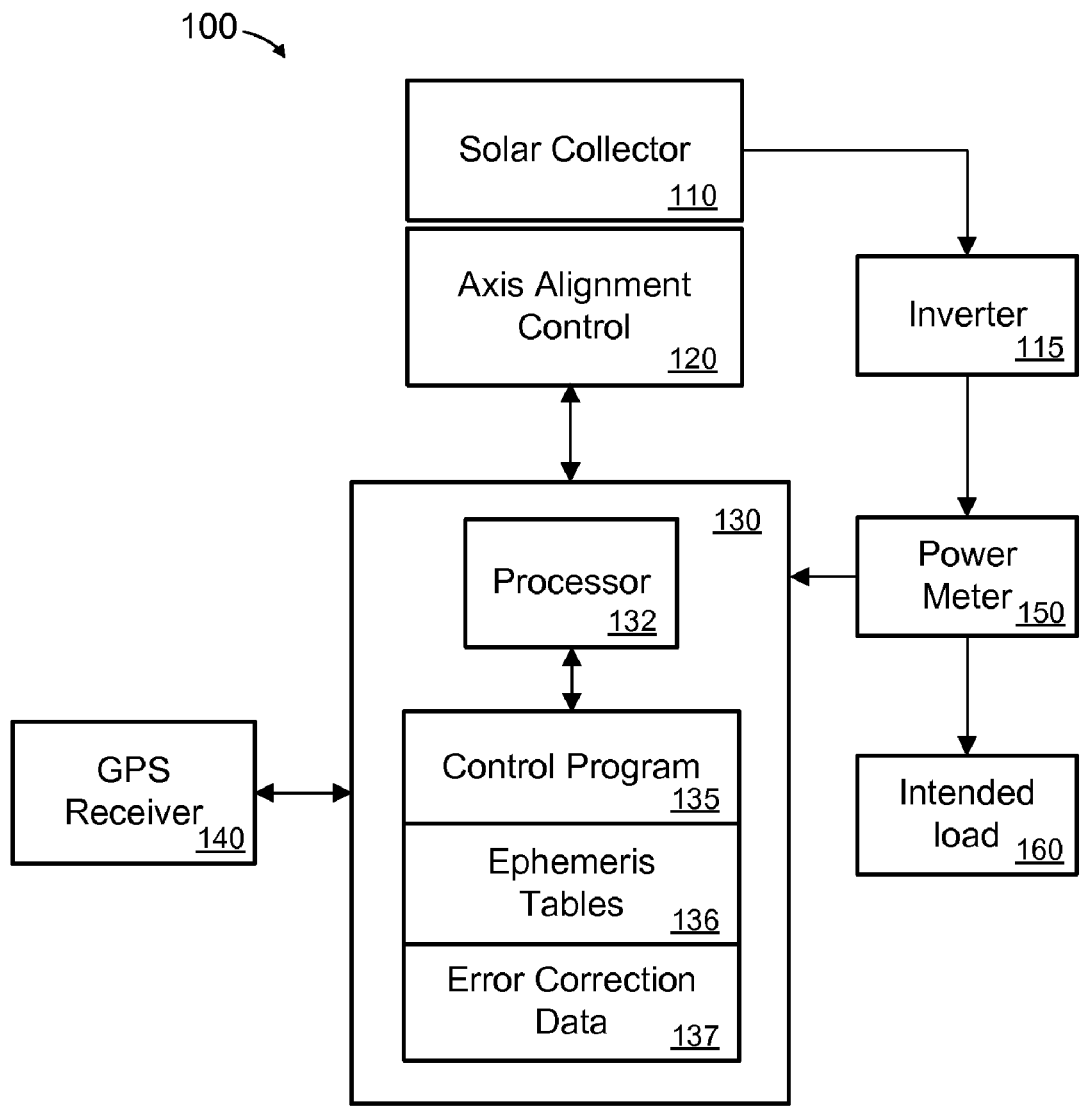
FIG. 1 is a block diagram of a system according to some embodiments.

FIG. 1 is a block diagram of system 100 according to some embodiments. System 100 may provide efficient solar tracking and improved power generation resulting therefrom. Embodiments are not limited to the elements and/or the configuration depicted in FIG. 1.

System 100 includes solar collector 110 and axis alignment control 120. Solar collector 110 may comprise any system for receiving solar radiation that is or becomes known. In some embodiments, solar collector 110 comprises a concentrating solar collector for receiving solar radiation, concentrating the solar radiation, and directing the concentrated radiation onto a solar cell. Solar collector 110 may comprise an array of individual solar collectors according to some embodiments.

Solar collector 110 may generate direct current in response to received solar radiation. Inverter 115 may receive the direct current and convert the direct current to alternating current. Any suitable inverter may be employed, including but not limited to an inverter employing a maximum power point tracking servo.

Axis alignment control 120 may comprise hardware and/or software for moving solar collector 110 with respect to a position in the sky. Some embodiments of axis alignment control 120 comprise an azimuthal drive to position solar collector 110 in the azimuth rotational plane and an elevational drive to position solar collector 110 in the elevational rotational plane. Axis alignment control 120 may comprise hydraulically-driven elements according to some embodiments. In some embodiments, axis alignment control 120 operates to position solar collector 110 so that an axis thereof (e.g., a central axis normal to a receiving surface) points at a desired position in the sky. The desired position may comprise a position of the sun, but embodiments are not limited thereto.

Control unit 130 includes processor 132 and storage. Processor 132 may comprise one or more microprocessors, microcontrollers and other devices to execute program code according to some embodiments. In this regard, storage stores control program 135 comprising executable program code. Processor 132 may execute the program code of control program 135 in order to operate system 100 according to one or more of the methods described herein.

Storage also stores ephemeris tables 136 providing solar positions corresponding to various dates and times. Determination of a solar position in some embodiments may be based on ephemeris tables 136 as well as on ephemeris equations embodied in program code of control program 135. Error correction data 137 may comprise data used to determine solar tracking error according to some embodiments. Such data may comprise data specifying a response of solar collector 110 for various degrees of tracking error, and/or data specifying a servo feedback signal magnitude for various degrees of tracking error. Examples of these data are described below. Error correction data 137 may comprise currently- and historically-determined solar tracking errors.

Global Positioning Satellite (GPS) receiver 140 may receive date, time and position data from the GPS network. Systems according to some embodiments may implement additional or alternative systems to retrieve date, time and/or position data, including but not limited to radio and GPS-like systems. This data may be used in conjunction with ephemeris equations and/or ephemeris tables 136 to determine a solar position as is known in the art.

Power meter 150 receives alternating current from inverter 115, measures an associated power, and provides the measurement to control unit 130. As will be described below, a servo feedback signal may be derived from the measured power associated with various positions of solar collector 120. Subsequent positioning of solar collector 120 may be determined based on the servo feedback signal. In some embodiments, inverter 115 determines a power delivered by solar collector 110 during operation of inverter 115. Accordingly, control unit 130 may obtain the power measurements directly from inverter 115 and power meter 150 may be omitted.

Intended load 160 may comprise any device, network, or combination thereof intended to receive power generated by solar collector 110. Intended load 160 may comprise a private or public power grid to which solar collector 110 provides power. Intended load 160 may be coupled to a dedicated motor or energy storage device to be supplied power by solar collector 110, and/or may comprise a general-purpose power grid. Depending on a particular implementation, intended load 160 may be coupled directly to solar collector 110, to inverter 115 or to any other device(s). In this regard, intended load 160 may be coupled between collector 110 and power meter 150.

Figure 2:
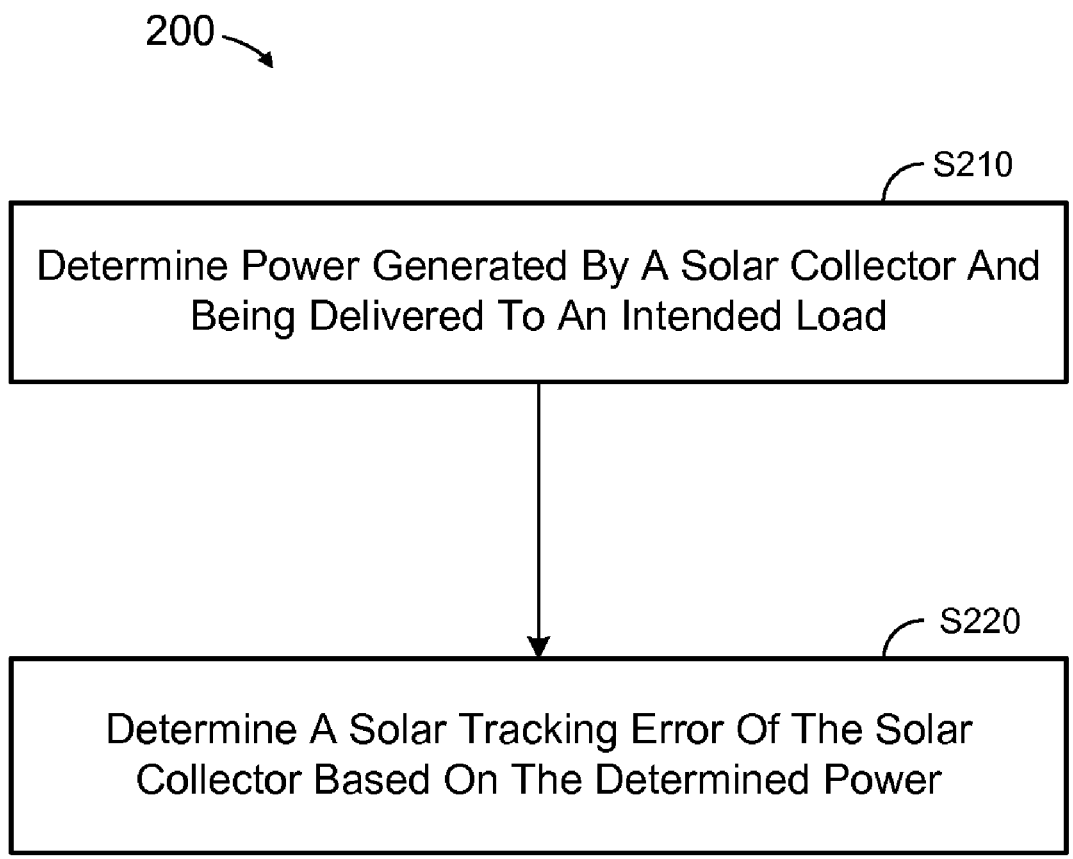
FIG. 2 is a flow diagram of a process according to some embodiments.

FIG. 2 is a flow diagram of process 200 according to some embodiments. Process 200 and all other processes described herein may be executed by one or more elements of system 100 in conjunction with zero or more other elements. Although described herein with respect to specific systems, these processes may be implemented and executed differently than as described.

Initially, at S210, power generated by a solar collector is determined. The power is determined while the power is being delivered to an intended load. In some embodiments of S210, power meter 150 determines power delivered to intended load 160 by solar collector 110. Power meter 150 may receive alternating current from inverter 115, may measure a power associated with the alternating current using any system for measuring power that is or becomes known, and may transmit data specifying the measured power to control unit 130. In some embodiments, one or neither of power meter 150 and inverter 115 are disposed between solar collector 110 and intended load 160.

A solar tracking error of the solar collector is determined based on the determined power at S220. According to some embodiments, processor 132 executes control program 135 to determine a solar tracking error vector based on the power-related data received from power meter 150. The vector represents a distance and direction through which solar collector 110 should be moved to substantially maximize the power delivered to intended load 160 by solar collector 110.

The foregoing features stand in direct contrast to existing systems which determine a solar position, as opposed to a solar tracking error. Moreover, such existing systems determine the solar position based on short-circuit current or on power generated by a solar collector while disconnected from an intended load.

As will be described in various examples below, a servo feedback signal may be determined based on the determined power, and the solar tracking error may be determined at S220 based on the servo feedback signal. In some embodiments, determination of the solar tracking error at S220 may be further based on a relationship between a response of the solar collector and tracking error.

Figure 3:
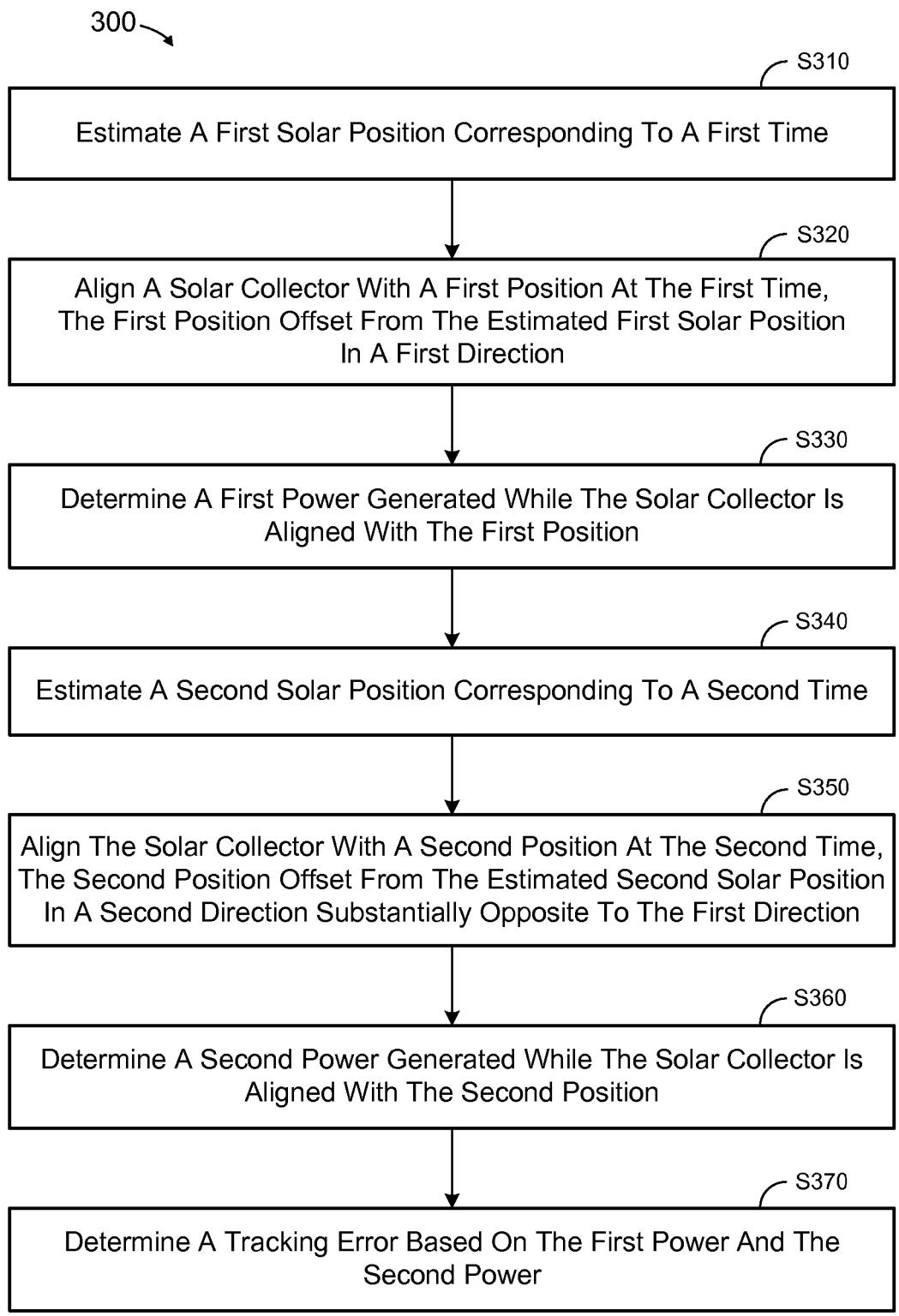
FIG. 3 is a flow diagram of a process according to some embodiments.

FIG. 3 is a flow diagram of process 300 according to some embodiments. Process 300 may comprise an implementation of process 200, but embodiments are not limited thereto. More specifically, S310 through S360 may comprise an implementation of S210 of process 200, while S370 may comprise an implementation of S220 of process 200.

At S310, a first solar position corresponding to a first time is estimated. The first solar position may be estimated using any system for estimating a solar position that is or becomes known. According to some embodiments, GPS receiver 140 receives date, time and location data and control program 135 is executed to estimate a solar position based on the GPS data and on ephemeris tables 136. Estimation of the solar position at S310 may also take into account previously-acquired tracking error data as is known in the art. The estimated solar position may be expressed in terms of any suitable coordinate system. The actual solar position at the first time may differ from the estimated first solar position.

Next, at S320, a solar collector is aligned with a first position at the first time. The first position is offset from the estimated first solar position in a first direction. Aligning the solar collector at S320 may comprise orienting the solar collector such that the solar collector would receive solar radiation substantially at its preferred angle of incidence if the sun were positioned at the first position. With respect to system 100, S320 may comprise transmitting appropriate commands from control unit 130 to axis alignment control 120 to ensure alignment of a central axis of solar collector 110 with the first position. Such commands may include commands to rotate in one or both of the azimuthal and elevational directions.

Figure 4:
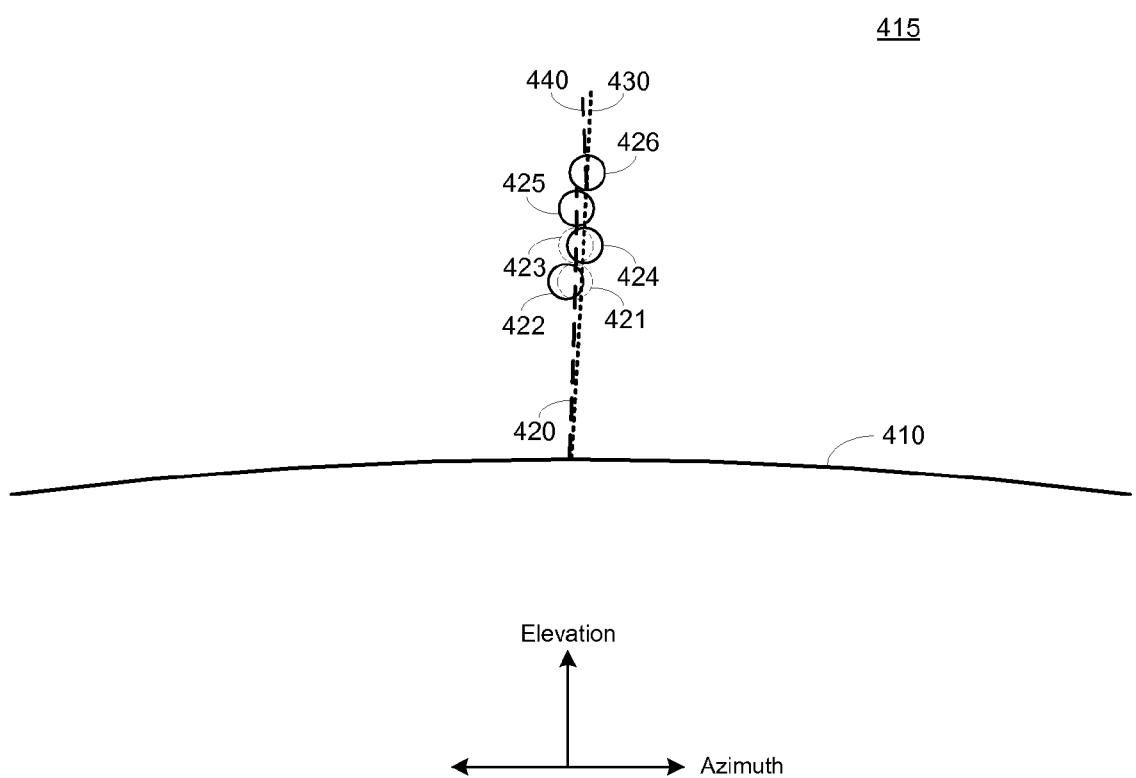
FIG. 4 is a view of positions with which a solar collector may be aligned over time according to some embodiments.

FIG. 4 illustrates the first position and the estimated first solar position according to some embodiments. More specifically, FIG. 4 illustrates horizon 410 and sky 415 as viewed from solar collector 110.

Path 420 represents the apparent path of the sun as currently estimated by system 100. Path 420 may or may not reflect the actual path that was or will be taken by the sun. According to the present example, a dashed circle shows first solar position 421 as estimated at S310. The apparent size of an estimated first solar position in the sky may differ from the size of first solar position 421 of FIG. 4. A solid circle depicts first position 422 with which the solar collector is aligned at S320. A described above, first position 422 is offset from estimated first solar position 421 in a first direction normal to path 420.

At S330, while the solar collector is aligned with the first position, a first power generated by the solar collector is determined. As described above, power meter 150 may determine the generated power and provide control unit 130 with an indication of the determined power.

Figure 5:
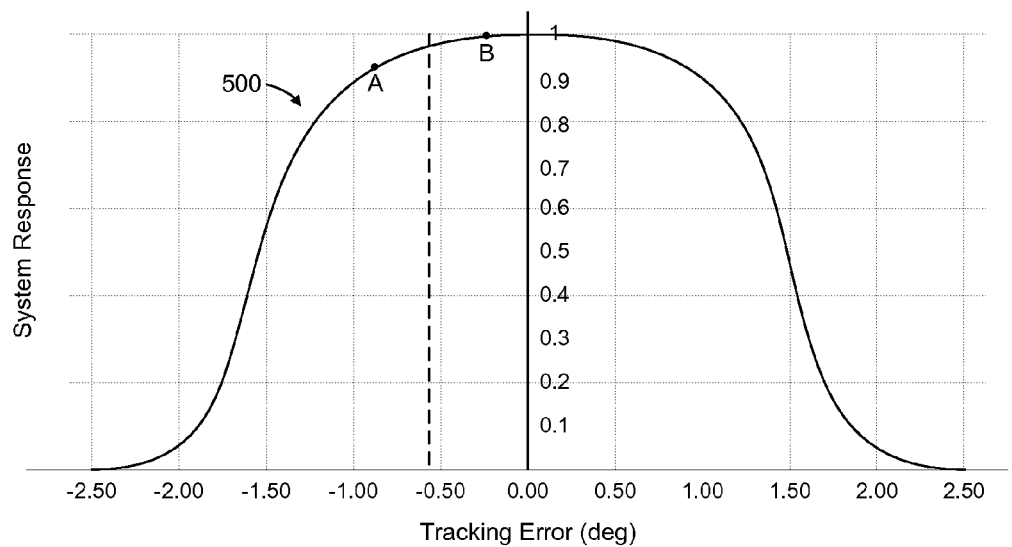
FIG. 5 is a graph illustrating a relationship between a solar collector response and tracking error according to some embodiments.

A response (e.g., power output) of solar collector may be represented as a function of solar tracking error. FIG. 5 illustrates response curve 500 of solar collector 110 according to some embodiments. Curve 500 represents a response of solar collector 110 with respect to tracking error in the direction across the solar path. As shown, system response drops rapidly below 90% for tracking errors of greater than one degree in magnitude. In some embodiments, solar collector 110 is thereby defined as having an acceptance angle of one degree.

A response curve such as curve 500 may be determined upon fabrication of solar collector 110, installation of solar collector 110, periodically during operation, and/or in response to data indicating possible errors. In some embodiments, an operator of control unit 130 initially determines an actual solar position by moving solar collector 110 via axis alignment control 120 while monitoring an output of power meter 150. Solar collector 110 is then moved automatically according to a calibration algorithm to acquire the data of curve 500. Error correction data 137 may store data representing response curves such as curve 500.

For purposes of the present example, it will be assumed that the actual apparent path of the sun is depicted by path 430 of FIG. 4. Accordingly, alignment of solar collector 110 with first position 422 will result in a system response (e.g., power output) of less than 100%. The actual system response will depend on the tracking error between first position 422 and the actual solar position, and on the system response curve of solar collector 110.

A second solar position corresponding to a second time is estimated at S340. The second solar position may be estimated by the system that was used to estimate the first solar position at S310. The solar collector is then aligned, at S350, with a second position at the second time. The second position is offset from the estimated second solar position in a second direction, and the second direction is substantially opposite to the first direction. Alignment at S350 may comprise controlling axis alignment control 120 to align the central axis of solar collector 110 with the second position.

Returning to FIG. 4 and the present example, a dashed circle shows second solar position 423 as estimated at S340. The estimated second solar position may be farther from or closer to estimated first solar position 421 along path 420 than depicted in FIG. 4, and may overlap partially therewith. The distance between second solar position 423 and estimated first solar position 421 depends at least in part on a difference between the first time and the second time.

A solid circle depicts second position 424 with which the solar collector is aligned at S350. As shown, second position 424 is offset from estimated second solar position 423 in a second direction substantially opposite to the first direction from which first position 422 is offset from estimated first solar position 421. Both the first direction and the second direction are substantially normal to path 420 in the present example.

The magnitude of the offsets from the estimated solar positions may depend on a response of solar collector 110. Generally, the offsets may be selected such that the solar collector 110 will typically generate some power (though not necessarily maximum power) when aligned with the first position and when aligned with the second position. For example, in a case where an acceptance angle of solar collector 110 is one degree, the offset from the estimated first solar position and the offset from the estimated second solar position may each equal 0.1 degree. Embodiments are not limited to this particular offset, or to offsets of equal magnitude.

A second power generated by the solar collector is determined at S360 while the solar collector is aligned with the second position. As shown in FIG. 4, second position 424 lies directly on actual solar path 430, while first position 422 is further away from path 430. Accordingly, based on response curve 500, the second power should be greater than the first power determined at S330.

A solar tracking error is determined at S370. The solar tracking error is based on at least the first power and the second power. In some embodiments of S370, points of curve 500 are located which correspond to the determined first power and second power. Since the second power is greater than the first power in the present example, points A (corresponding to the first power at the first position) and B (corresponding to the second power at the second position) are located on the positively-sloped portion of curve 500. In some embodiments, the solar tracking error may be determined as the mean of the tracking errors corresponding to points A and B (i.e., ~0.6 degrees).

Figure 6:
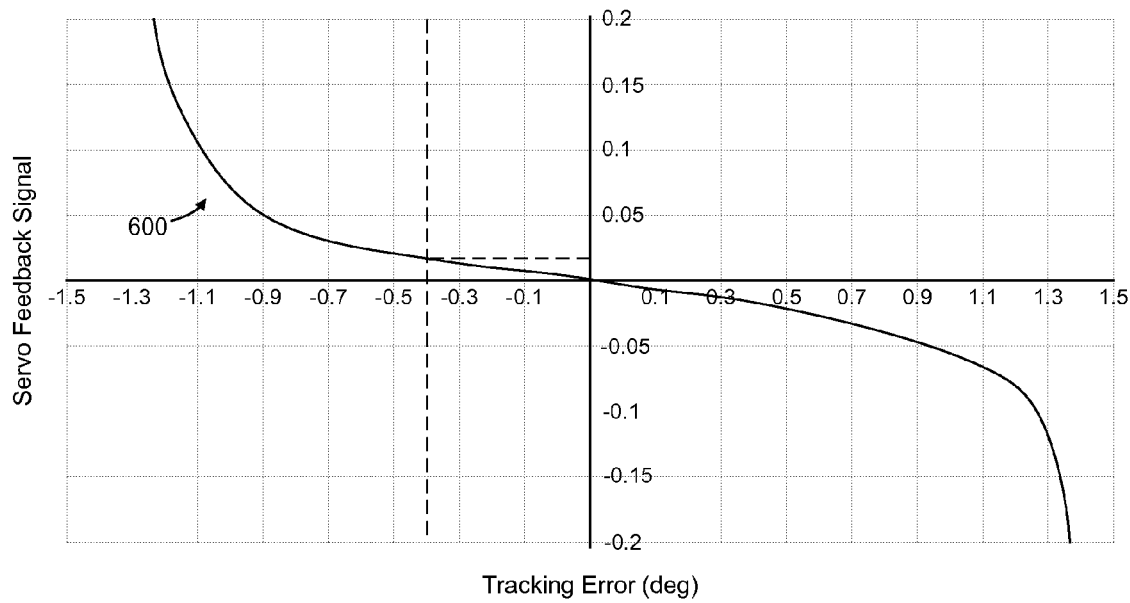
FIG. 6 is a graph illustrating a relationship between servo feedback signals and tracking error according to some embodiments.

FIG. 6 is a graph illustrating a relationship between servo feedback signals and tracking error according to some embodiments. Curve 600 is based on a relationship between solar collector response and tracking error (e.g., curve 500), on a particular servo feedback signal equation, and on the known angular offset between the first position and the second position (e.g., 0.2 degrees). Curve 600 may be used at S370 to determine solar tracking error based on at least the first power and the second power.

The servo feedback signal equation represented by curve 600 is $2*(P_A-P_B)/(P_A+P_B)$, where $P_A$ is the first power and $P_B$ is the second power. The denominator of the servo feedback signal equation may normalize the tracking error determination to address particularly dim or bright days. Curve 600 indicates a corresponding tracking error for each of various values of this servo feedback signal. Since the various values of this servo feedback signal correspond to various combinations of $P_A$ and $P_B$, the tracking error corresponding to each value may be derived from curve 500.

In operation, the above servo feedback signal equation is evaluated to determine a servo feedback signal. A point of curve 600 is located corresponding to the determined signal, and the tracking error associated with the point is noted. The dashed lines of FIG. 6, for example, illustrate a case in which the servo feedback signal is determined to be 0.015. A corresponding solar tracking error of −0.4 degrees is determined from curve 600 at S370.

A next position of solar collector 110 may be updated based on the determined solar tracking error. For example, an estimation of a next solar position may incorporate the determined solar tracking error. In some embodiments, system 100 comprises a servo response for controlling axis alignment control 120 based on the servo feedback signal. The servo response may be designed to reflect curve 600, such that a particular y input (servo feedback signal) results in a corresponding −x response (−tracking error).

It may be difficult or otherwise inefficient to implement a servo response as shown in curve 600. Some embodiments may therefore determine and correct tracking error based on a linearized version of a relationship between a servo feedback signal and tracking error. The tracking error and corresponding response may be determined based simply on a slope of the linearized relationship.

Figure 7:
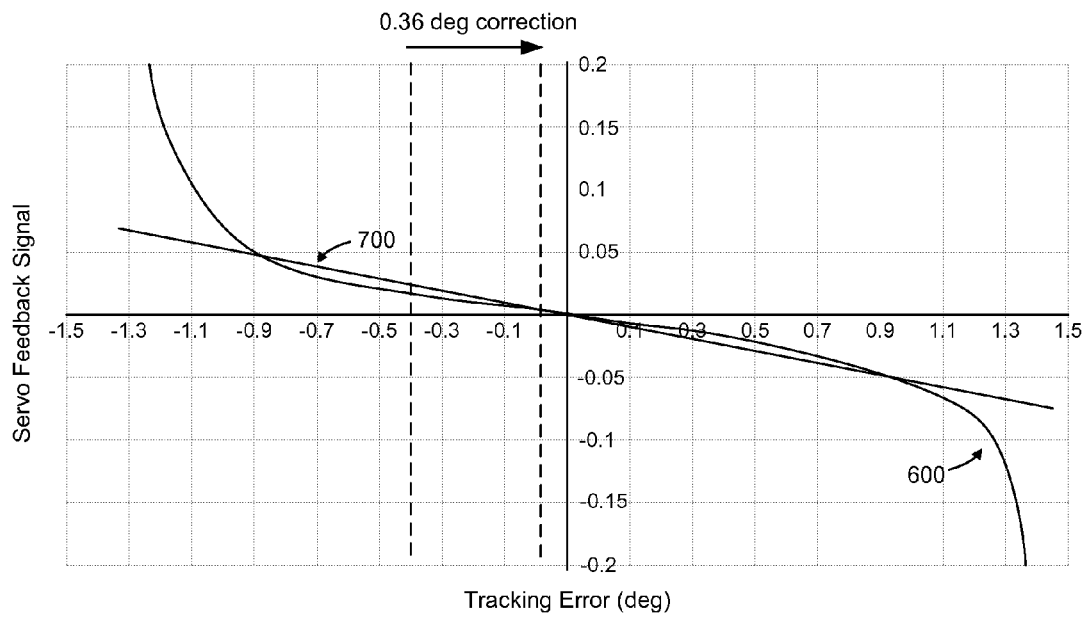
FIG. 7 is a graph illustrating tracking error determination according to some embodiments.

FIG. 7 illustrates linearized approximation 700 based on curve 600 of FIG. 6. According to the illustrated example, approximation 700 is relatively representative of curve 600 between −0.9 and 0.9 degrees of tracking error. The slope of approximation 700 is (−0.05/0.9/deg)=−0.055/deg.

A value of the servo feedback signal equation may be determined based on a first power and a second power as described above. It will be assumed that the determined value is 0.02, which corresponds to an actual tracking error of −0.4 degrees. The system response may be modeled such that the position T of solar collector 110 at time i+1=$T_i$−$TES_i$/m, where $TES_i$ is the value of the servo feedback signal at time I and m is the slope of approximation 700. Accordingly, $T_{i+1}$=$T_i$−(−0.02/−0.055)=$T_i$+0.36. The determined solar tracking error (and correction value) is therefore +0.36 degrees.

Due to fit error between curve 500 and approximation 600, a 0.36 degree correction results in a 0.04 degree tracking error (i.e., −0.40+0.36=−0.04). FIG. 7 illustrates the 0.36 correction and resulting residual error. Process 300 may be executed iteratively to further reduce the residual error.

Figure 8:
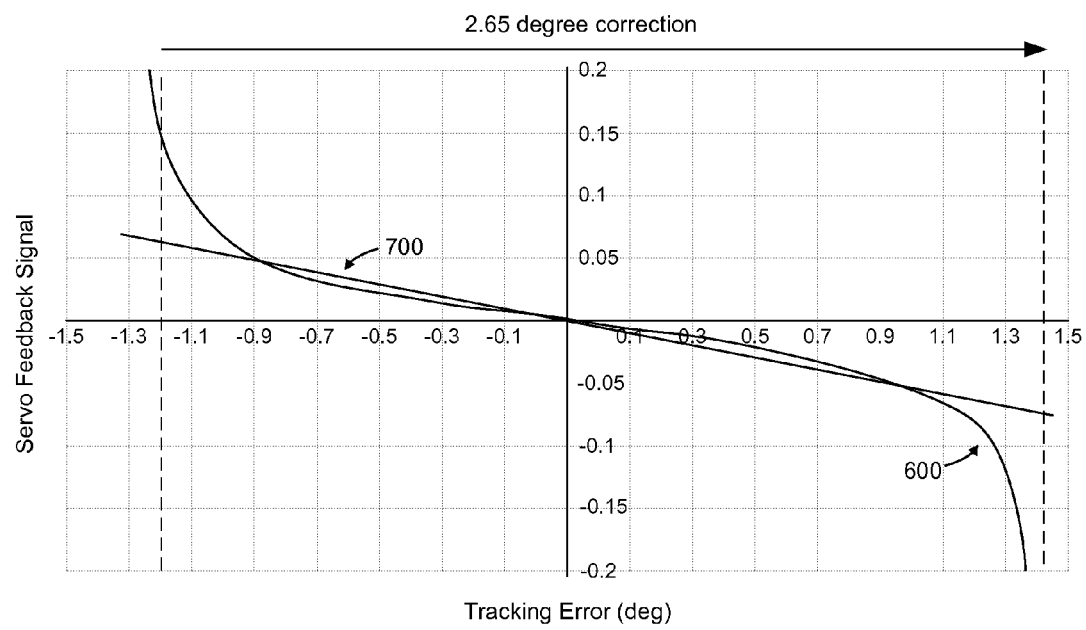
FIG. 8 is a graph illustrating incorrect tracking error determination.

FIG. 8 illustrates a scenario in which usage of approximation 700 to determine and correct tracking error may lead to divergent system behavior. Generally, FIG. 8 illustrates a problem that may result from servo feedback signal values which are outside the linearized portion of curve 600 (i.e., from −0.9 to 0.9 degrees).

The determined value of the servo feedback signal is 0.146, which corresponds (based on curve 600) to an actual tracking error of −1.2 degrees. However, based on the slope of approximation 700, the updated position $T_{i+1}$ of solar collector 110 is calculated as $T_i$−(0.146/−0.055)=$T_i$+2.65. As shown, a +2.65 degree correction results in a new tracking error of −1.2+2.65=+1.45 degrees.

Various systems may be employed to avoid the behavior shown in FIG. 8 while maintaining some advantages of the system illustrated in FIG. 7. For example, tracking error correction may be disabled for certain servo feedback signal values or absolute power values. In some embodiments, a maximum function is applied to the servo feedback signal value so that determination of the solar tracking error is performed only based on values of the servo feedback signal falling in the linearized portion of curve 600.

Some embodiments may determine the solar tracking error based on additional power measurements and/or other servo feedback signal equations. For example, prior to S370, a third solar position corresponding to a third time may be estimated. The solar collector may be aligned with the third estimated solar position at the third time, and a third power generated while the solar collector is aligned with the third position may be determined. FIG. 4 illustrates estimated third solar position 425 according to some embodiments. Position 425 is located on path 420 and slightly overlaps actual solar path 430 in this example.

A servo feedback signal equation incorporating the first power, the second power, and the third power may be used at S370 to determine the solar tracking error. The servo feedback signal equation according to some examples may be $(P_A-P_B)/(P_C)$, where $P_A$ is the first power, $P_B$ is the second power and $P_C$ is the third power. Again, the denominator of the servo feedback signal equation may normalize the tracking error determination to address particularly dim or bright days.

As described with respect to FIG. 6, the solar tracking error may be determined based on a relationship between solar collector response and tracking error (e.g., curve 500) and on the particular servo feedback signal equation (i.e., $(P_A-P_B)/(P_C)$). The relationship indicates a corresponding tracking error for each of various values produced by the servo feedback signal equation, and may be represented by a curve such as curve 600. To determine a solar tracking error, the above servo feedback signal equation is evaluated and the curve is used to determine an associated solar tracking error. A linearized or other approximation of the curve may be employed as described above.

Embodiments are not limited to the servo feedback signal equations described above. Moreover, embodiments are not limited to servo feedback signals equations incorporating two or three power samples.

FIG. 4 also illustrates correction of a solar collector position according to some embodiments. As shown, solar position 426 corresponding to a fourth time is estimated based on a determined solar tracking error and solar collector 110 is aligned therewith. Solar position 426 lies on corrected path 440 now modeled by system 100. Process 300 may continue according to any of the embodiments and variations described above to again determine a solar tracking error and correct an alignment of solar collector 110 based thereon.

The above examples describe first and second positions offset from estimated first and second solar positions in directions substantially normal to estimated solar path 420. According to some embodiments of process 300, the first direction of S320 and the second direction of S350 are along an estimated solar path. Such embodiments may determine a solar tracking error along the solar path.

Figure 9:
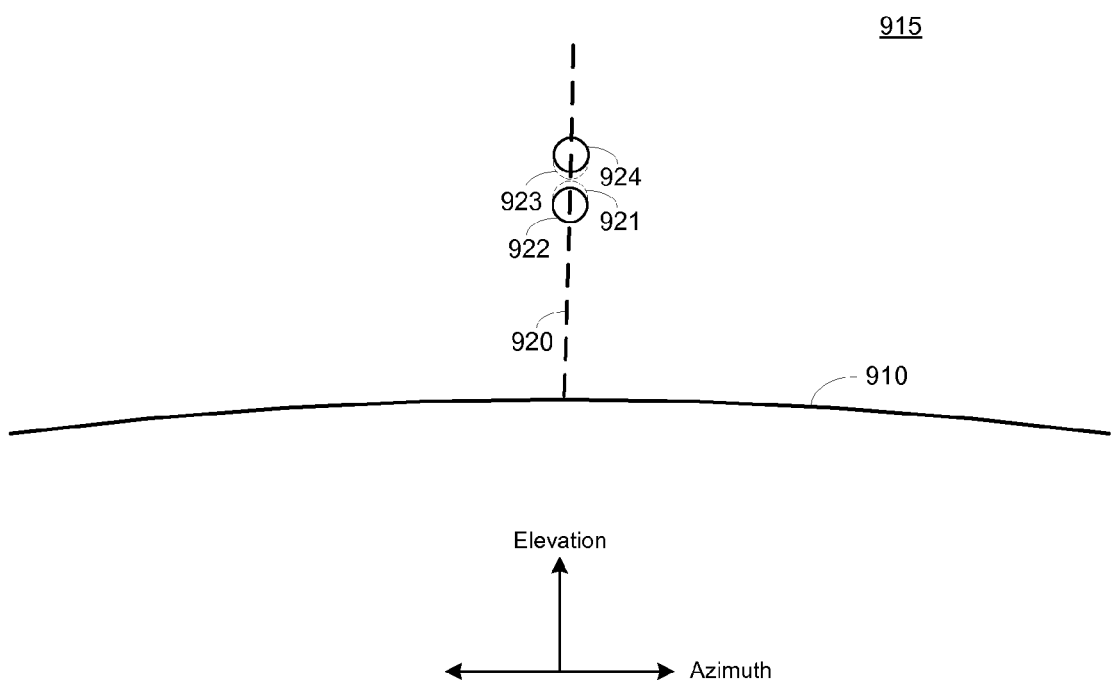
FIG. 9 is a view of positions with which a solar collector may be aligned over time according to some embodiments.

FIG. 9 shows horizon 910 and sky 915 as viewed from solar collector 110. Path 920 represents the apparent path of the sun as estimated by system 100. According to the present example of process 300, first solar position 921 (shown as a dashed circle) is estimated at S310. At S320, solar collector 110 is aligned with first position 922 (shown as a solid circle). First position 922 is offset from estimated first solar position 921 in a first direction along path 920. As described above, a first power generated by solar collector 110 is determined at S330 while solar collector 110 is aligned with first position 922.

Next, at S340, second solar position 923 (shown as a dashed circle) corresponding to a second time is estimated. Solar collector 110 is then aligned with second position 924 at S350 and a second power is determined while solar collector 110 is aligned with second position 924. Second position 924 is offset from estimated second solar position 923 in a second direction along path 920 and substantially opposite to the first direction.

Determination of the solar tracking error based on the first power and the second power may proceed according to any of the techniques described above. For example, the solar tracking error may be determined based on a relationship between a response of solar collector 110 and tracking error. Since the tracking error of interest is in a direction along path 920, the relationship between the tracking error and the system response may differ from the relationship used with respect to the FIG. 4 embodiment.

Some embodiments determine solar tracking error across an estimated solar path using processes illustrated by FIG. 4 and determine solar tracking error along an estimated solar path using processes illustrated by FIG. 9. While such determinations may proceed as described above based on sampled power values, the solar collector may be aligned with desired positions and the power values may be sampled in any suitable order.

For example, the solar collector may be aligned at a first time with a first position offset from an estimated first solar position in a first direction normal to an estimated solar path, and may be aligned at a second time with a second position offset from an estimated second solar position in a second direction along the estimated solar path. The solar collector may then be aligned at a third time with a third position offset from the estimated third solar position in a third direction normal to an estimated solar path and substantially opposite the first direction, and may be aligned at a fourth time with a fourth position offset from an estimated fourth solar position in a fourth direction along the estimated solar path and substantially opposite the second direction. A solar tracking error in the direction normal to the path may then be determined based on power samples acquired at the first and third times, and a solar tracking error in the direction along the path may be determined based on power samples acquired at the second and fourth times.

As described above, determination of solar tracking error at S370 may be based on a relationship between solar collector response and tracking error. Such a relationship may be represented by data such as curve 500, curve 600 and approximation 700. This relationship may change over time due to mechanical shifting, component degradation, etc. According to some embodiments, the relationship may therefore be recalculated periodically and/or in response to particular events. For example, control program 135 may be executed to recalculate a relationship between solar collector response and tracking error every month, after determination of a fault associated with the solar collector, after detection of power output less than a threshold amount, and/or at any suitable occasion.

Determination of solar tracking error may be improved by methods to achieve a suitable signal-to-noise ratio of the acquired power information. Generally, the power information may be acquired in a manner intended to reduce the effect of noise sources on the acquired information. According to some embodiments, power information (e.g., the first power and the second power) is acquired from a signal line (e.g., from inverter 115 to power meter 150) at a first frequency. The power information, as described above, is associated with power generated by a solar collector. The first frequency is substantially orthogonal to a frequency of at least one noise source associated with the signal line. Such acquisition may substantially filter orthogonal frequency bands from the acquired power information. According to some embodiments, hardware and/or software filters may be applied to the acquired power information to further filter frequencies orthogonal to the first frequency.

Power information may acquired so as to filter signal characteristics other than (or in addition to) frequency. In some embodiments, a phase at which the power information is acquired is substantially orthogonal to a frequency of at least one noise source associated with the signal line.

Potential noise sources of system 100, for example, include intended load 160 to which solar collector 110 may be coupled and inverter 115. In a case that intended load 160 is a power grid, the signal line may be associated with noise sources having frequencies of 50 Hz/60 Hz and harmonic/subharmonics thereof. Inverter 115 may comprise a control servo causing periodic fluctuations in its output signal. Some inverters, for example, include a control servo exhibiting an operating frequency of ¼ Hz. Accordingly, the first frequency with which power information is acquired from a signal line may be substantially orthogonal to the oscillation frequency of intended load 160 and/or the operating frequency of the control servo of inverter 115.

Any system which utilizes power information associated with power generated by a solar collector may benefit from acquisition of the power information from a signal line in accordance with a signal characteristic that is substantially orthogonal to a corresponding signal characteristic of at least one noise source associated with the signal line. With reference to process 300, S330 may include receiving a first power-related signal from inverter 115 and determining the first power based on the first power-related signal at time $t_1$, and S360 may include receiving a second power-related signal from inverter 115 and determining the second power based on the second power-related signal at time $t_2$. Time $t_1$ and time $t_2$ may be selected such that a difference therebetween is substantially orthogonal to (e.g., not an integer multiple of) a period of a control servo of inverter 115. Using the above-mentioned control servo period of four seconds (i.e., ¼ Hz), the difference between time $t_1$ and time $t_2$ may be thirty seconds. Determination of solar tracking error based on the thusly-acquired first power and second power may then proceed according to any methods described herein.

Embodiments are mentioned above in which solar tracking error is determined across an estimated solar path as well as along an estimated solar path. According to some of such embodiments, the movement of solar collector 110 across the solar path may present a noise source which reduces a signal-to-noise ratio of power information used to determine solar tracking error along the estimated solar path. Similarly, the movement of solar collector 110 along the solar path may present a noise source reduces a signal-to-noise ratio of power information used to determine solar tracking error across the estimated solar path. Therefore, in some embodiments, power information used to determine solar tracking error across the estimated solar path is acquired at a frequency which is substantially orthogonal to the frequency with which power information used to determine solar tracking error along the estimated solar path is acquired.

Figure 10:
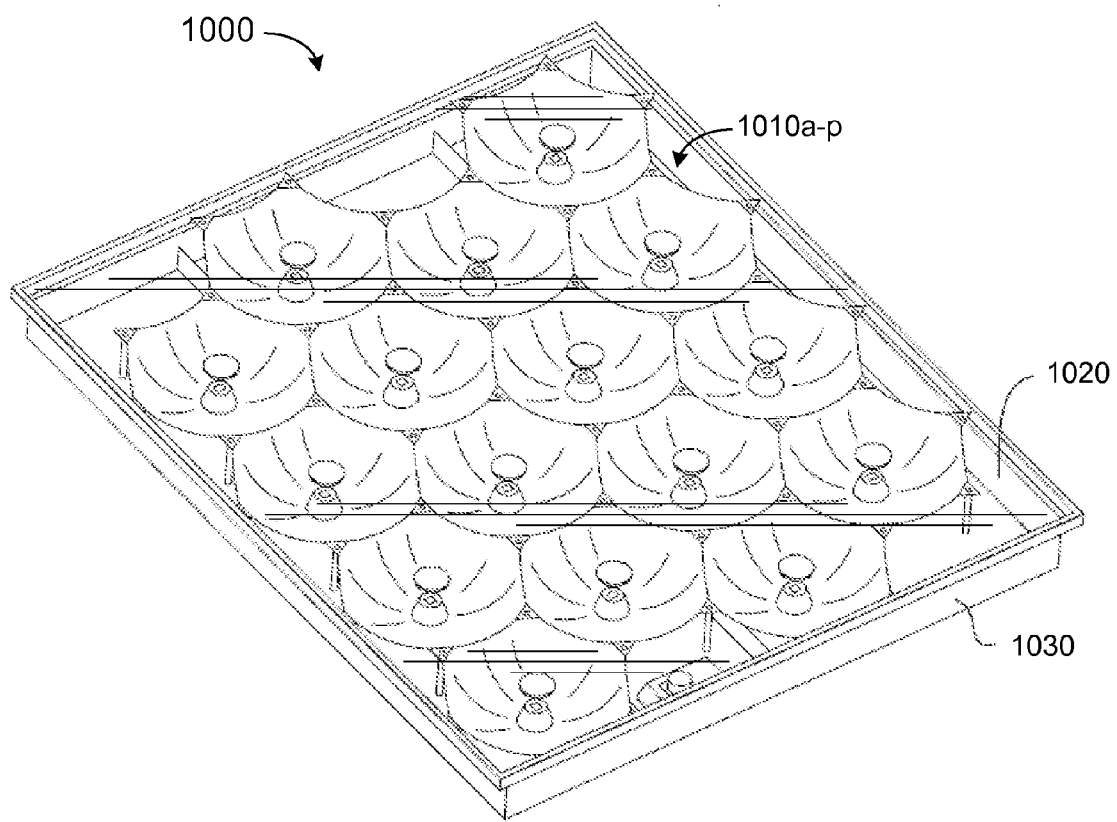
FIG. 10 is a perspective view of a solar collector array according to some embodiments.

FIG. 10 is a perspective view of solar collector 1000 according to some embodiments. Solar collector 1000 may generate electrical power from incoming solar radiation. Solar collector 1000 comprises sixteen instantiations 10910*a-p* of concentrating solar collectors. Each of concentrating solar collectors 1010*a-p* may be connected in series to create an electrical circuit during reception of light by solar collector 1000. Embodiments are not limited to the arrangement shown in FIG. 10.

As described in U.S. Patent Application Publication No. 2006/0266408, each of concentrating solar collectors 1010*a-p* includes a primary mirror to receive incoming solar radiation and a secondary mirror to receive radiation reflected by the primary mirror. Each secondary mirror then reflects the received radiation toward an active area of a solar cell within a corresponding one of collectors 1010*a-p*.

A perimeter of each primary mirror may be substantially hexagonal to allow adjacent sides to closely abut one another as shown. In some embodiments, a perimeter of each primary mirror is square-shaped. Each primary mirror may comprise low iron soda-lime or borosilicate glass with silver deposited thereon, and each secondary mirror may comprise silver and a passivation layer formed on a substrate of soda-lime glass. The reflective coatings of the primary and secondary mirrors may be selected to provide a desired spectral response to the wavelengths of solar radiation to be collected, concentrated and converted to electricity by collector 1000.

Each primary mirror and secondary mirror is physically coupled to substantially planar window or cover glazing 1020. Each of collectors 1010*a-p* is also to coupled to backpan 1030. Backpan 1030 may comprise any suitable shape and/or materials and may provide strength and heat dissipation to collector 1000. The electrical current generated by each of concentrating solar collectors 1010*a-p* may be received by external circuitry coupled to backpan 1030 in any suitable manner. Collector 1000 may be mounted on a sun-tracking device to maintain a desired position relative to the sun during daylight hours.

Figure 11:
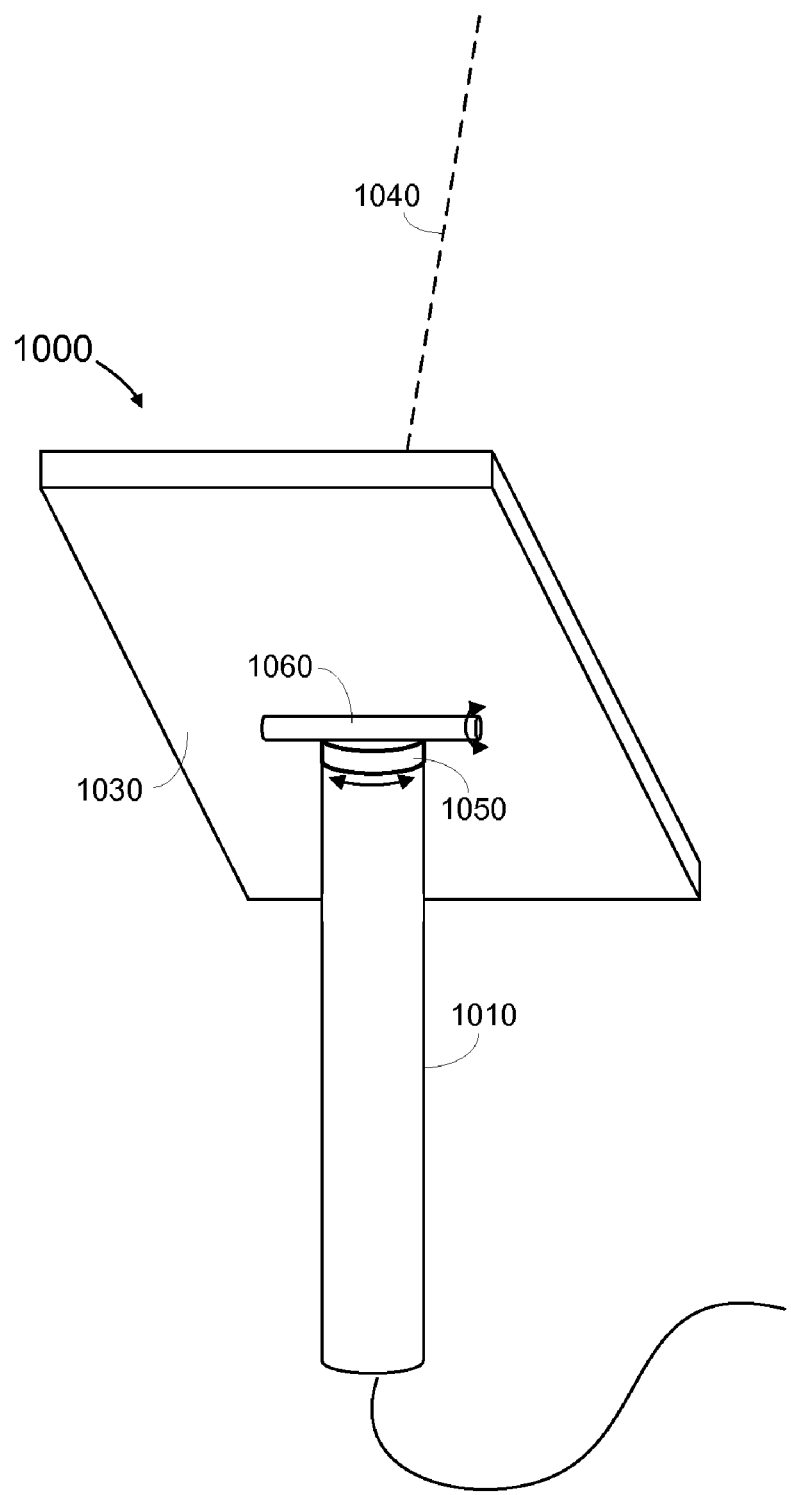
FIG. 11 is a perspective view of a system according to some embodiments.

FIG. 11 is a perspective rear view of solar collector 1000 mounted to support 1010 according to some embodiments. Also shown is axis 1040 of solar collector 1000. Ideally, axis 1040 is defined such that solar collector 1000 exhibits a maximum response if axis 1040 is pointed directly at the sun (i.e., incoming solar radiation is parallel to axis 1040).

Alignment device 1050 is mounted on support 1010 and is coupled to alignment device 1060. Alignment device 1060 is in turn coupled to backpan 1030 of collector 1000. Alignment device 1050 may be operated to rotate solar collector 1000 and axis 1040 in an azimuthal direction, while alignment device 1060 may be operated to rotate solar collector 1000 and axis 1040 in an elevational direction. Embodiments are not limited to the arrangement depicted in FIG. 11, nor are embodiments limited to movement in the azimuthal and/or elevational directions.

One or more other devices may be coupled to support 1010 to provide any desired functions, including but not limited to conversion of alternating current to direct current, power measurement, GPS data reception, and control of alignment devices 1050 and 1060 based on received commands. Such a device may execute a control program to determine solar tracking error as described herein. Solar collector 1000 and alignment devices 1050 and 1060 may be monitored and controlled by a remotely-located control unit in some embodiments. As mentioned above with respect to system 100, an output of solar collector 1000 is coupled to an intended load.

Figure 12:
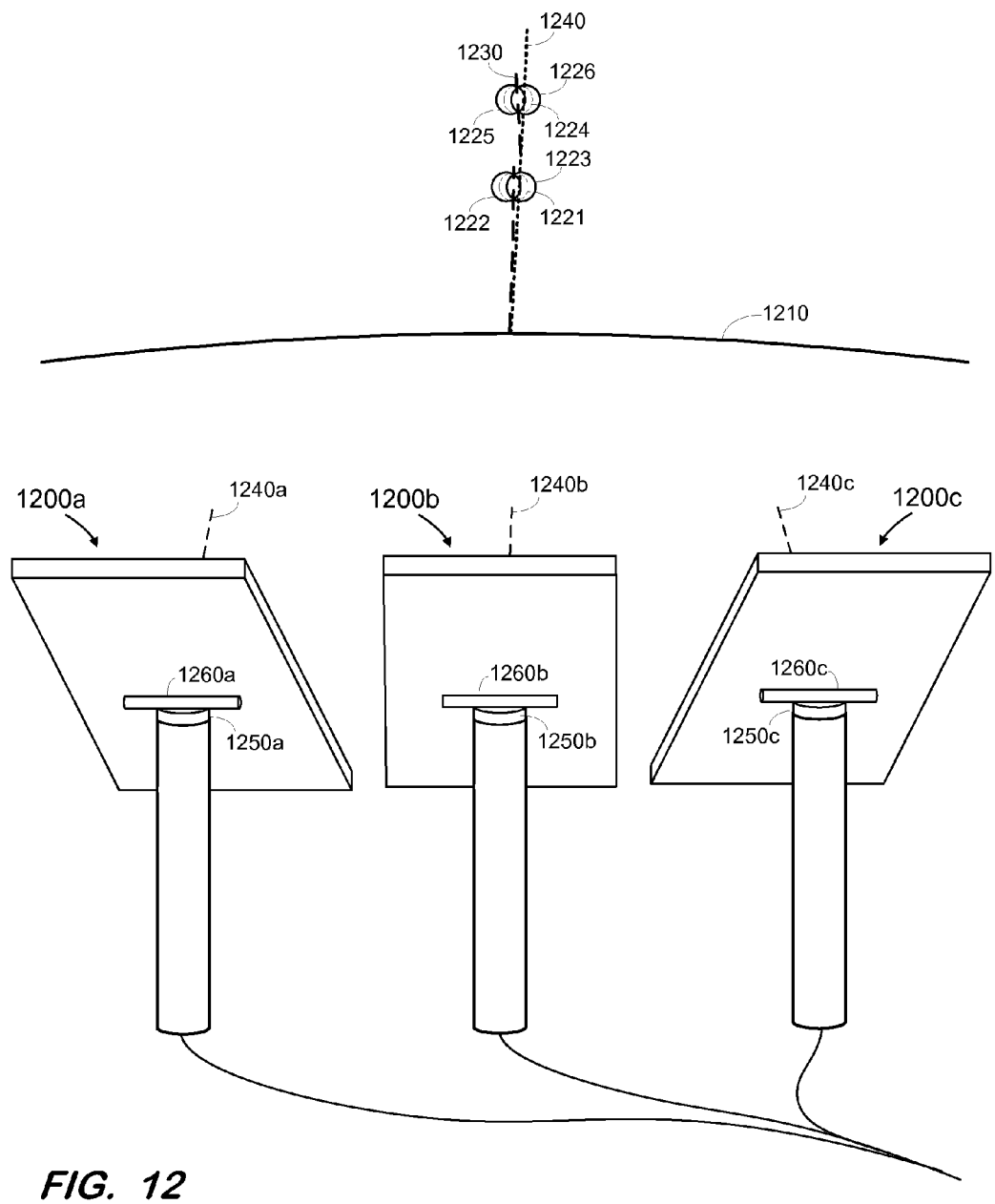
FIG. 12 is a perspective view of a system according to some embodiments.

FIG. 12 is a perspective view of solar collectors 1200*a-* 1200*c* according to some embodiments. An output of each of solar collectors 1200*a*-1200*c* is coupled to an intended load. Each of solar collectors 1200*a*-1200*c* may comprise an instantiation of solar collector 1000 described above, but embodiments are not limited thereto. One of solar collectors 1200*a*-1200*c* may differ in any manner from any other of solar collectors 1200*a*-1200*c*. Embodiments are also not limited to three solar collectors.

Figure 13:
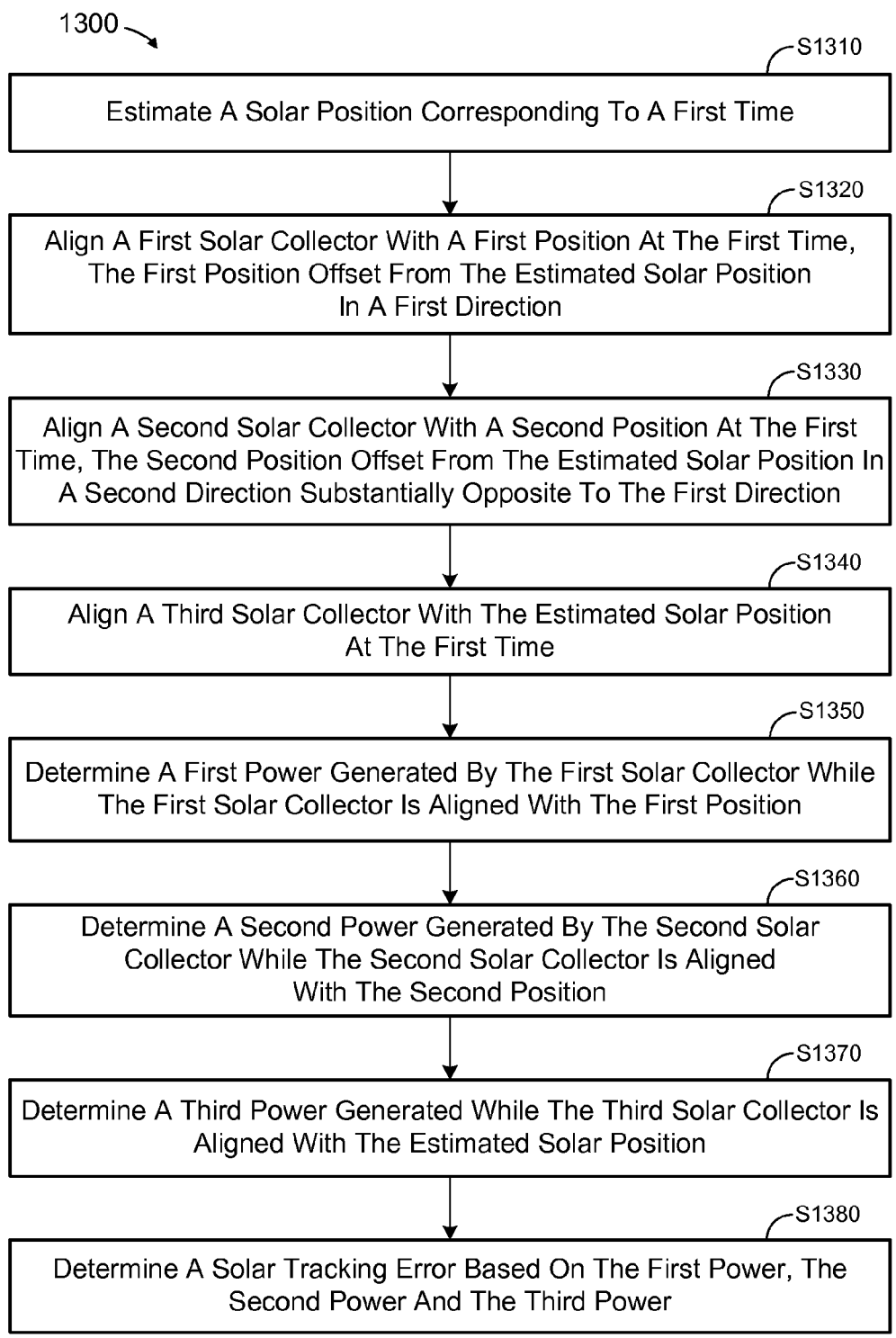
FIG. 13 is a flow diagram of a process according to some embodiments.

Process 1300 of FIG. 13 may comprise an implementation of process 200 of FIG. 2 using solar collectors 1200*a*-1200*c*. Process 1300 may therefore be used to determine a solar tracking error based on a determination of power delivered to a intended load.

A solar position corresponding to a first time is estimated at S1310. The first solar position may be estimated using any system for estimating a solar position that is or becomes known, including those described above with respect to S310. A first solar collector is then aligned, at S1320, with a first position at the first time. The first position is offset from the estimated first solar position in a first direction. Accordingly, S1320 may comprise transmitting appropriate commands alignment devices 1250*a* and 1260*a* to ensure alignment of axis 1240*a* of solar collector 1200*a* with the first position.

As described above, the first position may be offset from the estimated solar position in any direction. For purposes of the present example, the offset will be assumed to be across an estimated solar path. Accordingly, FIG. 12 illustrates horizon 1210, sky 1215, estimated first solar position 1221 and first position 1222 with which solar collector 1200*a* may be aligned at S1320.

S1330 comprises aligning a second solar collector with a second position at the first time. The second position is offset from the estimated first solar position in a second direction substantially opposite to the first direction. Continuing with the above example, alignment at S1330 may comprise controlling devices 1250*c* and 1260*c* to align axis 1240*c* of solar collector 1200*c* with second position 1223. The magnitude of the offsets from the estimated solar position may depend on a response curve of solar collectors 1200*a*-1200*c*.

Also at the first time, and at S1340, a third solar collector is aligned with the estimated first solar position. Devices 1250*b* and 1260*b* may be controlled to align axis 1240*b* of solar collector 1200*b* with estimated first solar position 1221.

S1350 through S1370 comprise determining a power generated by the first, second and third solar collectors, respectively, while aligned with the positions mentioned above. To determine the generated power, a dedicated power meter may be coupled to a signal line of each of collectors 1200*a*-1200*c*, or a single power meter may receive input from each solar collector and determine the generated power therefrom.

A solar tracking error is determined at S1380. The solar tracking error is based on at least the first power, the second power and the third power. The solar tracking error may be determined as described above with respect to S370 of process 300. More specifically, the solar tracking error may be determined based on a relationship between a response of solar collectors 1200*a*-1200*c* and tracking error (e.g., curve 500), based on a relationship between servo feedback signals and tracking error (e.g., curve 600), or on a linearized approximation thereof (e.g., curve 700).

Some embodiments determine the solar tracking error at S1380 using the servo feedback signal equation $(P_A-P_B)/(P_C)$, where $P_A$ is the first power, $P_B$ is the second power and $P_C$ is the third power. The servo feedback signal equation is evaluated to determine a servo feedback signal. Assuming that curve 600 indicates a corresponding tracking error for each of various values of the servo feedback signal equation, a point of curve 600 is located corresponding to the determined signal, and the tracking error associated with the point is noted. Each of solar collectors 1200a-1200c is associated with its own curve, and the curve used at S1380 may comprise some combination of the associated curves.

A next position of solar collectors 1200a-1200c may be updated based on the determined solar tracking error. For example, an estimation of a next solar position may incorporate the determined solar tracking error. Path 1230 may represent a path determined according to the next estimated solar position, while path 1240 represents an actual apparent solar path.

FIG. 12 also illustrates estimated solar position 1224, first position 1225 and second position 1226 which may correspond to a subsequent iteration of process 1300. The particular one of solar collectors 1200a-1200c aligned with each of positions 1224-1226 may be modified from that described above. For example, solar collector 1200b may be aligned with first position 1225, solar collector 1200c may be aligned with estimated solar position 1224, and solar collector 1200a may be aligned with second position 1226. Determinations of the first, second and third powers and of the solar tracking error may then proceed as described above.

Any suitable variations described with respect to process 300 may be incorporated into process 1300. In some embodiments, only a first power associated with a first offset position and a second power associated with a second offset position are determined, and the solar tracking error is determined using a servo feedback signal equation including only the first power and the second power.

According to some embodiments, each of collectors 1200a-1200c may individually perform process 300. Multiple iterations of process 1300 may nest within iterations of process 300 in some embodiments. For example, each of collectors 1200a-1200c may independently perform process 300 to determine a respective solar tracking error for each of collectors 1200a-1200c. Process 1300 may then be performed periodically for a desired number of iterations and/or until any other suitable condition occurs, at which point process 300 is again performed by each of collectors 1200a-1200c. This combination may provide high temporal bandwidth associated with process 1300, and routine calibration associated with process 300. A system response of any or all of solar collectors 1200a-1200c may be recalculated at any suitable juncture.

When performing such a calibration pursuant to process 300, each of solar collectors 1200a-1200c may determine solar tracking error in a direction across an estimated solar path and in a direction along the estimated solar path as described above. As also described above, an acquisition frequency of power information associated with each of solar collectors 1200a-1200c may be substantially orthogonal to a frequency of at least one noise source. In this regard, periodic motion of one of solar collectors 1200a-1200c across or along the solar path may comprise a noise source affecting acquisition of power information associated with the other two of solar collectors 1200a-1200c.

Although the foregoing examples describe acquisition of power information as discrete samples, embodiments are not limited thereto. Specifically, a solar collector may be controlled so as to continuously "wobble" across (and/or along) an estimated solar path. Power information used to determine solar tracking error would therefore also comprise a continuous signal.

Figure 14:
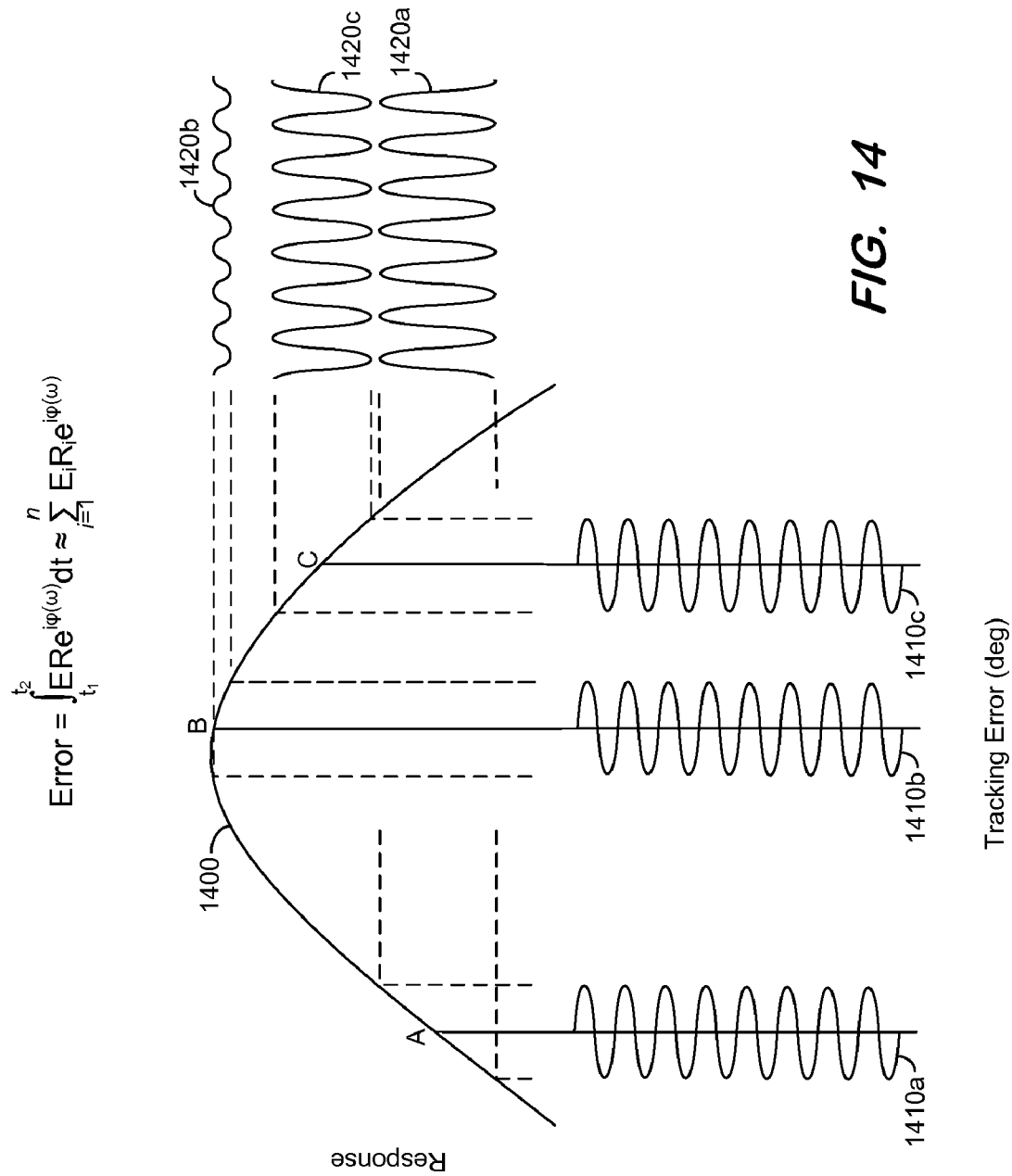
FIG. 14 illustrates generation of continuous servo feedback signals according to some embodiments.

FIG. 14 illustrates generation of power information based on a continuous wobble according to some embodiments. Curve 1400 illustrates a relationship between solar tracking error and solar collector response such as curve 500 described above. Collector paths 1410a-1410c illustrate continuous oscillation around positions corresponding to tracking errors A, B and C, respectively. As shown, motion along each of paths 1410a-1410c results in a corresponding oscillating power signal 1420a-1420c. Power signals 1420a-1420c indicate a magnitude and direction of solar tracking error. Accordingly, power signals 1420a-1420c may comprise a servo feedback signal that is used to update a solar collector position. FIG. 14 also shows an equation for deriving the error indicated by one of power signals 1420a-1420c, where I is an imaginary number, $\phi$ is the phase difference between an oscillation 1410 and the corresponding power signal 1420, and $\omega$ is the frequency of the oscillation 1410.

Continuous oscillation of a solar collector as depicted in FIG. 14 may result in unacceptable wear on conventional tracking devices. Hydraulic tracking devices may be more suitable for effecting such motion, but may be cost-prohibitive in some scenarios.

Figure 15:
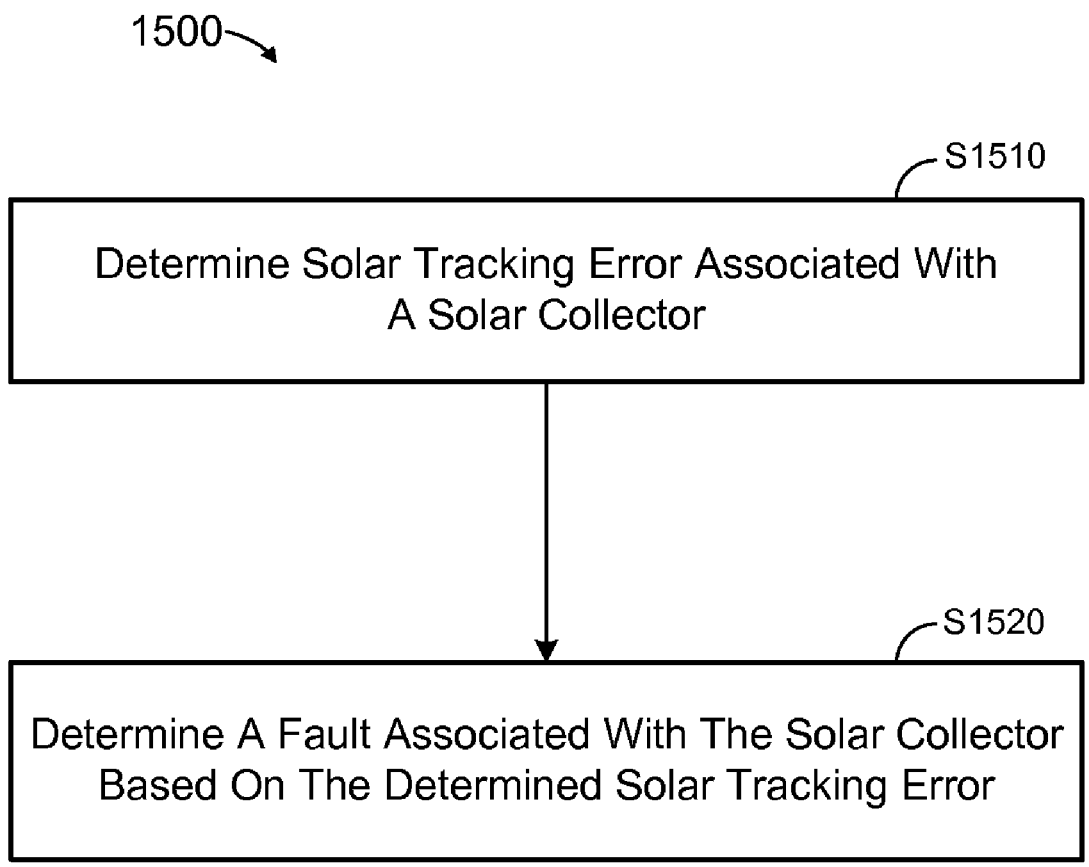
FIG. 15 is a flow diagram of a process according to some embodiments.

Some methods described herein result in the determination of solar tracking error. FIG. 15 is a flow diagram of process 1500 based on determined solar tracking error according to some embodiments. Initially, at S1510, solar tracking error associated with a solar collector is determined. Any system for determining solar tracking error may be employed at S1510, including one or more systems and variations described herein, and any other system that is or becomes known.

Next, at S1520, a fault associated with the solar collector is determined based on the determined solar tracking error. According to some embodiments of S1520, a fault is determined if the determined solar tracking error exceeds a threshold amount. Such a threshold amount may be outside of any tracking error expected to be encountered during operation.

As mentioned above, determined solar tracking errors may be stored among data such as error correction data 137. Error correction data 137 may therefore include current and previously-determined solar tracking errors associated with the solar collector. Accordingly, determination of the fault at S1520 may be based on a comparison between the determined solar tracking error and a plurality of previously-determined solar tracking errors associated with the solar collector.

In some embodiments, a tracking error vs. time function is fit to the determined solar tracking error and the plurality of previously-determined solar tracking errors. A derivative of the function is determined, and the derivative of the function is compared with a threshold value. A fault may be determined if a magnitude of the derivative exceeds the threshold value (i.e., if a rate of change of the solar tracking error exceeds a threshold rate).

Determination of the fault at S1520 may also be based on a solar tracking error associated with another solar collector. For example, a second solar tracking error associated with a second solar collector may be determined, and the solar tracking error may be compared to the second solar tracking error in order to determine the fault at S1520. More particularly, a fault may be determined if a difference between the solar tracking error and the second solar tracking error is greater than a threshold.

In some embodiments, comparison of the solar tracking error to the second solar tracking error may include comparing between a rate of change of solar tracking error associated with the solar collector with a rate of change of second solar tracking error associated with the second solar collector. Some aspects therefore include fitting a first tracking error vs. time function to the determined solar tracking error and a plurality of previously-determined solar tracking errors associated with the solar collector, determining a derivative of the first tracking error vs. time function, fitting a second tracking error vs. time function to the determined second solar tracking error and a plurality of previously-determined solar tracking errors associated with the second solar collector, determining a derivative of the second tracking error vs. time function, and comparing the derivative of the first tracking error vs. time function to the derivative of the second tracking error vs. time function.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. A method comprising:
   acquiring power information from a signal line in accordance with a first signal characteristic, the power information associated with power generated by a solar collector,
   wherein the first signal characteristic is substantially orthogonal to a corresponding signal characteristic of at least one noise source associated with the signal line.

2. A method according to claim 1, wherein the first signal characteristic comprises a first frequency that is substantially orthogonal to an operating frequency of a control servo of an inverter coupled to the signal line.

3. A method according to claim 2, wherein the first frequency is substantially orthogonal to a frequency of a power grid coupled to the signal line.

4. A method according to claim 1, further comprising:
   determining a solar tracking error associated with the solar collector based on the acquired power information.

5. A method according to claim 4, further comprising:
   determining a servo feedback signal based on the acquired power information,
   wherein determining the solar tracking error comprises determining the solar tracking error based on the servo feedback signal.

6. A method according to claim 5, wherein determining the solar tracking error further comprises:
   determining the solar tracking error based on the servo feedback signal and on a relationship between a response of the solar collector and tracking error.

7. A method according to claim 6, wherein determining the solar tracking error comprises:
   determining a servo feedback signal based on the acquired power information and on a servo feedback signal equation; and
   determining the solar tracking error based on the servo feedback signal and on a determined relationship between servo feedback signals and tracking error, the determined relationship associated with the solar collector and based on the servo feedback signal equation and the relationship between the response of the solar collector and tracking error.

8. A method according to claim 4, wherein acquiring power information comprises:
   estimating a first solar position corresponding to a first time;
   aligning the solar collector with a first position at the first time, the first position offset from the estimated first solar position in a first direction;
   determining a first power generated while the solar collector is aligned with the first position;
   estimating a second solar position corresponding to a second time;
   aligning the solar collector with a second position at the second time, the second position offset from the estimated second solar position in a second direction substantially opposite to the first direction; and
   determining a second power generated while the solar collector is aligned with the second position, and
   wherein determining the solar tracking error comprises determining a solar tracking error based on the first power and the second power.

9. A method according to claim 8, wherein determining the solar tracking error comprises:
   determining the solar tracking error based on the first power, the second power, and on a relationship between a response of the solar collector and tracking error, the relationship associated with the solar collector.

10. A method according to claim 9, wherein determining the solar tracking error comprises:
    determining a servo feedback signal based on the first power, the second power, and a servo feedback signal equation; and
    determining the solar tracking error based on the servo feedback signal and on a determined relationship between servo feedback signals and tracking error, the determined relationship associated with the solar collector and based on the servo feedback signal equation and the relationship between the response of the solar collector and tracking error.

11. A system comprising:
    a solar collector to generate power;
    a signal line to carry power generated by the solar collector; and
    a device to acquire power information associated with power generated by the solar collector from the signal line in accordance with a first signal characteristic,
    wherein the first signal characteristic is substantially orthogonal to a corresponding signal characteristic of at least one noise source associated with the signal line.

12. A system according to claim 11, further comprising:
    an inverter coupled to the signal line,
    wherein the first signal characteristic comprises a first frequency that is substantially orthogonal to an operating frequency of a control servo of the inverter.

13. A system according to claim 12, wherein the first frequency is substantially orthogonal to a frequency of a power grid coupled to the signal line.

14. A system according to claim 11, further comprising:
    a processor to determine a solar tracking error associated with the solar collector based on the acquired power information.

15. A system according to claim 14, the processor further to determine a servo feedback signal based on the acquired power information,
    wherein determination of the solar tracking error comprises determination of the solar tracking error based on the servo feedback signal.

16. A system according to claim 15, wherein determination of the solar tracking error further comprises:

determination of the solar tracking error based on the servo feedback signal and on a relationship between a response of the solar collector and tracking error.

17. A system according to claim 16, wherein determination the solar tracking error comprises:
   determination of a servo feedback signal based on the acquired power information and on a servo feedback signal equation; and
   determination of the solar tracking error based on the servo feedback signal and on a determined relationship between servo feedback signals and tracking error, the determined relationship associated with the solar collector and based on the servo feedback signal equation and the relationship between the response of the solar collector and tracking error.

18. A system according to claim 14, the processor further to:
   estimate a first solar position corresponding to a first time;
   align the solar collector with a first position at the first time, the first position offset from the estimated first solar position in a first direction;
   determine a first power generated while the solar collector is aligned with the first position;
   estimate a second solar position corresponding to a second time;
   align the solar collector with a second position at the second time, the second position offset from the estimated second solar position in a second direction substantially opposite to the first direction; and
   determine a second power generated while the solar collector is aligned with the second position, and
   wherein determination of the solar tracking error comprises determination of a solar tracking error based on the first power and the second power.

19. A system according to claim 18, wherein determination of the solar tracking error comprises:
   determination of the solar tracking error based on the first power, the second power, and on a relationship between a response of the solar collector and tracking error, the relationship associated with the solar collector.

20. A system according to claim 19, wherein determination of the solar tracking error comprises:
   determination of a servo feedback signal based on the first power, the second power, and a servo feedback signal equation; and
   determination of the solar tracking error based on the servo feedback signal and on a determined relationship between servo feedback signals and tracking error, the determined relationship associated with the solar collector and based on the servo feedback signal equation and the relationship between the response of the solar collector and tracking error.

* * * * *